United States Patent
Liu et al.

(10) Patent No.: US 10,687,421 B1
(45) Date of Patent: Jun. 16, 2020

(54) FABRIC WITH WOVEN WIRE BRAID

(71) Applicant: Flex Ltd., Singapore (SG)

(72) Inventors: Weifeng Liu, Dublin, CA (US);
William Uy, San Jose, CA (US); Jie Lian, San Jose, CA (US); Zhen Feng, San Jose, CA (US); Robert Pennings, San Jose, CA (US); Anwar Mohammed, San Jose, CA (US); Murad Kurwa, San Jose, CA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 15/945,363

(22) Filed: Apr. 4, 2018

(51) Int. Cl.
*H05K 1/03* (2006.01)
*H05K 1/11* (2006.01)
(Continued)

(52) U.S. Cl.
CPC ........... *H05K 1/111* (2013.01); *D04C 1/02* (2013.01); *D04C 1/06* (2013.01); *H05K 1/028* (2013.01); *H05K 1/038* (2013.01); *H05K 1/118* (2013.01); *H05K 1/189* (2013.01); *H05K 5/065* (2013.01); *D03D 1/0082* (2013.01); *D03D 15/0083* (2013.01); *D03D 2700/0166* (2013.01); *D10B 2101/20* (2013.01); *D10B 2401/16* (2013.01); *H05K 3/341* (2013.01); *H05K 2201/0347* (2013.01); *H05K 2201/09445* (2013.01); *H05K 2201/10106* (2013.01)

(58) Field of Classification Search
CPC ........... H05K 1/038; H05K 2201/0281; H05K 2201/029; H05K 1/111; H05K 1/118; H05K 1/189; H05K 5/065; H01B 7/083; A41D 1/005; D03D 1/0082; H01R 12/592; D04C 1/02

USPC ...................................................... 174/117 M
See application file for complete search history.

(56) References Cited

U.S. PATENT DOCUMENTS 3,708,349 A    1/1973  Macaulay
3,711,627 A *  1/1973  Maringulov ........... H01B 7/083
                                                        139/425 R
(Continued)

OTHER PUBLICATIONS

Final office action dated Feb. 19, 2019, U.S. Appl. No. 15/874,649, filed Jan. 18, 2018, applicant: Michael James Glickman, Art Unit: 2847, 25 pages.

*Primary Examiner* — Roshn K Varghese
(74) *Attorney, Agent, or Firm* — Haverstock & Owens LLP

(57) ABSTRACT

A conductive fabric includes a fabric with one or more electrically conductive wire braids woven into the fabric. The one or more wire braids are woven into the fabric such that one or more portions of each wire braid are exposed at one or more surfaces of the fabric, the exposed portions of the wire braid forming connection pads. Each connection pad provides an electrical connection point for attachment to a complementary electrical connection point on an electronic component, such as a bond pad, solder bump, or connection lead. A single wire braid can be used to electrically interconnect multiple electronic components. Multiple wire braids can be arranged, with appropriate spacing and alignment of exposed portions, to electrically interconnect multiple electronic components with multiple electrical interconnects between one or more electronic components. Each electrically conductive wire braid includes a plurality of individual electrically conductive wires braided together.

10 Claims, 2 Drawing Sheets

(51) Int. Cl.
*H05K 1/18* (2006.01)
*H05K 5/06* (2006.01)
*D04C 1/02* (2006.01)
*D04C 1/06* (2006.01)
*H05K 1/02* (2006.01)
*D03D 15/00* (2006.01)
*H05K 3/34* (2006.01)
*D03D 1/00* (2006.01)

(56) References Cited

U.S. PATENT DOCUMENTS

| | | | |
|---|---|---|---|
| 3,993,508 A | 11/1976 | Erlichman | |
| 4,367,572 A | 1/1983 | Zielenski | |
| 4,492,949 A | 1/1985 | Peterson | |
| 4,722,464 A | 2/1988 | Wright | |
| 4,756,717 A | 7/1988 | Sturgis | |
| 4,774,530 A | 9/1988 | Hawkins | |
| 5,291,374 A | 3/1994 | Hirata | |
| 5,626,135 A | 5/1997 | Sanfilippo | |
| 5,739,254 A | 4/1998 | Fuller | |
| 5,761,809 A | 6/1998 | Fuller | |
| 5,762,812 A | 6/1998 | Narang | |
| 5,849,809 A | 12/1998 | Narang | |
| 5,863,963 A | 1/1999 | Narang | |
| 5,945,253 A | 8/1999 | Narang | |
| 5,958,995 A | 9/1999 | Narang | |
| 5,994,425 A | 11/1999 | Narang | |
| 6,007,877 A | 12/1999 | Narang | |
| 6,124,372 A | 9/2000 | Smith | |
| 6,139,920 A | 10/2000 | Smith | |
| 6,260,956 B1 | 7/2001 | Narang | |
| 6,302,523 B1 | 10/2001 | Smith | |
| 6,370,034 B1 | 4/2002 | Busch | |
| 6,534,723 B1 | 3/2003 | Asai | |
| 6,797,881 B2 * | 9/2004 | Nakamura | H01L 23/49822 174/539 |
| 6,830,848 B1 | 12/2004 | Fujiwara | |
| 6,964,205 B2 | 11/2005 | Papakostas | |
| 7,456,571 B1 | 11/2008 | Wedding | |
| 7,578,195 B2 | 8/2009 | DeAngelis | |
| 9,148,949 B2 * | 9/2015 | Zhou | H05K 1/038 |
| 10,117,328 B1 | 10/2018 | Zhong | |
| 2002/0018042 A1 | 2/2002 | Albert | |
| 2003/0129905 A1 * | 7/2003 | Dhawan | B01D 39/083 442/316 |
| 2003/0227079 A1 | 12/2003 | Chia | |
| 2004/0009729 A1 * | 1/2004 | Hill | D02G 3/441 442/208 |
| 2004/0094835 A1 | 5/2004 | Maghribi | |
| 2004/0243204 A1 | 12/2004 | Maghribi | |
| 2004/0256725 A1 | 12/2004 | Inoue | |
| 2005/0122700 A1 | 6/2005 | Kim | |
| 2006/0035554 A1 * | 2/2006 | Glaser | D02G 3/441 442/301 |
| 2007/0096260 A1 | 5/2007 | Eshun | |
| 2008/0018611 A1 | 1/2008 | Serban | |
| 2008/0044127 A1 | 2/2008 | Leising | |
| 2008/0139953 A1 | 6/2008 | Baker | |
| 2009/0108270 A1 | 4/2009 | Chen | |
| 2009/0257166 A1 | 10/2009 | Kim | |
| 2009/0272197 A1 | 11/2009 | RidgoGranado | |
| 2010/0014265 A1 | 1/2010 | Sagisaka | |
| 2010/0160762 A1 | 1/2010 | McLaughlin | |
| 2010/0063365 A1 | 3/2010 | Pisani | |
| 2010/0071205 A1 * | 3/2010 | Graumann | D03D 1/0088 29/825 |
| 2010/0107770 A1 | 5/2010 | Serban | |
| 2010/0185076 A1 | 7/2010 | Jeong | |
| 2010/0259925 A1 * | 10/2010 | Hsu | D03D 1/0088 362/231 |
| 2011/0067904 A1 | 3/2011 | Aoyoma | |
| 2011/0180306 A1 | 7/2011 | Naganuma | |
| 2011/0180307 A1 | 7/2011 | Naganuma | |
| 2011/0194262 A1 | 8/2011 | Naganuma | |
| 2011/0198111 A1 | 8/2011 | Naganuma | |
| 2011/0199739 A1 | 8/2011 | Naganuma | |
| 2011/0203837 A1 | 8/2011 | Naganuma | |
| 2012/0032224 A1 * | 2/2012 | Fang | H01R 4/58 257/99 |
| 2012/0052268 A1 | 3/2012 | Axisa | |
| 2013/0019383 A1 | 1/2013 | Korkala | |
| 2013/0038545 A1 | 2/2013 | Hsu | |
| 2013/0060115 A1 | 3/2013 | Gehman | |
| 2013/0170158 A1 * | 7/2013 | Van Abeelen | D04B 1/12 361/749 |
| 2013/0176737 A1 * | 7/2013 | Zhou | H05K 1/038 361/749 |
| 2014/0124245 A1 | 5/2014 | Lai | |
| 2014/0190727 A1 | 7/2014 | Lee | |
| 2014/0209690 A1 | 7/2014 | Teng | |
| 2014/0343390 A1 | 11/2014 | Barzowska | |
| 2015/0065840 A1 | 3/2015 | Bailey | |
| 2015/0187863 A1 | 7/2015 | Zhu | |
| 2015/0261057 A1 | 9/2015 | Harris | |
| 2015/0280280 A1 | 10/2015 | Ardeili | |
| 2015/0366504 A1 | 12/2015 | Connor | |
| 2015/0380355 A1 | 12/2015 | Rogers | |
| 2016/0165723 A1 | 6/2016 | Romero | |
| 2016/0183372 A1 | 6/2016 | Park | |
| 2016/0284436 A1 * | 9/2016 | Fukuhara | D03D 1/0088 |
| 2016/0372718 A1 | 12/2016 | Keates | |
| 2017/0108459 A1 | 4/2017 | Katsuki | |
| 2017/0150602 A1 | 5/2017 | Johnston | |
| 2017/0172421 A1 | 6/2017 | Dabby | |
| 2017/0358841 A1 | 12/2017 | Chen | |
| 2018/0020563 A1 | 1/2018 | Hong | |
| 2018/0070446 A1 | 3/2018 | Takahashi | |

\* cited by examiner

FABRIC WITH WOVEN WIRE BRAID

FIELD OF THE INVENTION

The present invention is generally directed to the field of wearable electronics. More specifically, the present invention is directed to wearable electronics fabric having multiple electronic components with electrical connectivity provided by metal wire braid woven into the fabric.

BACKGROUND OF THE INVENTION

Electronic devices are increasingly being developed so as to be worn by a user, such as in wearable electronics. Many wearable electronics are designed as stand alone devices having an electronic component attached to band that is used for securing the device to a user, such as a wristwatch having a wrist-band or a heart-rate monitor having a band that wraps around a users chest. The electronic component of such devices often includes a housing with an integrated clasp or securing means for attaching to the band. Adhesive can also be used to secure the electronic component to the band. Instead of stand-alone devices, other wearable electronics are being integrated with clothing. Adhesives can also be used in these applications to secure the electronic component to a clothing fabric.

Metal wires are commonly used as electrical conductors between electronic devices. As applied to wearable electronics, providing electrical connectivity to or between one or more worn electrical devices is typically done using a separate electrical cable that includes a metal wire. However, having loose cables is often a nuisance and ungainly.

SUMMARY OF THE INVENTION

Embodiments of a conductive fabric are directed to a fabric with one or more electrically conductive wire braids woven into the fabric. The one or more wire braids are woven into the fabric such that one or more portions of each wire braid are exposed at one or more surfaces of the fabric, the exposed portions of the wire braid forming connection pads. Each connection pad provides an electrical connection point for attachment to a complementary electrical connection point on an electronic component, such as a bond pad, solder bump, or connection lead. A single wire braid can be used to electrically interconnect multiple electronic components. Multiple wire braids can be arranged, with appropriate spacing and alignment of exposed portions, to electrically interconnect multiple electronic components with multiple electrical interconnects between one or more electronic components. Each electrically conductive wire braid includes a plurality of individual electrically conductive wires braided together. In some embodiments, the fabric is a wearable fabric, such as a shirt or pants, or other form to be worn by a user, such as an armband, waistband, hat or shoes.

In an aspect, an electronics assembly is disclosed that includes a fabric, an electrically conductive wire braid, and an electronic component. The fabric has a first surface. The electrically conductive wire braid is woven into the fabric, wherein a portion of the electrically conductive wire braid is exposed at the first surface of the fabric, the exposed portion forming a connection pad. The electronic component has a connection point, wherein the connection point is mechanically and electrically attached to the connection pad of the electrically conductive wire braid. In some embodiments, wherein the connection point comprises a bond pad, a solder bump, or a metal lead. In some embodiments, the connection point is coupled to the connection pad of the electrically conductive wire braid via a solder joint, a welded joint or an electrically conductive adhesive. In some embodiments, the electrically conductive wire braid comprises a plurality of electrically conductive wires braided together. In some embodiments, each of the plurality of electrically conductive wires comprise a metal wire made of one or more of copper, silver, nickel and their alloys. In some embodiments, each of the plurality of electrically conductive wires comprise a metal wire with flux. In some embodiments, each of the plurality of electrically conductive wires comprise an electrically conductive plating finish. In some embodiments, the electronics assembly also includes an encapsulation layer coupled to the electronic component and the electrically conductive wire braid.

In another aspect, another electronics assembly is disclosed. The electronics assembly includes a fabric, a first electrically conductive wire braid, a second electrically conductive wire braid, and an electronic component. The fabric has a first surface. The first electrically conductive wire braid is woven into the fabric, wherein a first portion of the first electrically conductive wire braid is exposed at the first surface of the fabric, the exposed first portion forming a first connection pad. The second electrically conductive wire braid is woven into the fabric, wherein a second portion of the second electrically conductive wire braid is exposed at the first surface of the fabric, the exposed second portion forming a second connection pad. The electronic component has a first connection point and a second connection point. The first connection point is mechanically and electrically attached to the first connection pad of the first electrically conductive wire braid. The second connection point is mechanically and electrically attached to the second connection pad of the second electrically conductive wire braid.

In yet another aspect, yet another electronics assembly is disclosed. The electronics assembly includes a fabric, a first electrically conductive wire braid, a second electrically conductive wire braid, a first electronic component, and a second electronic component. The fabric has a first surface. The first electrically conductive wire braid is woven into the fabric, wherein a plurality of first portions of the first electrically conductive wire braid are exposed at the first surface of the fabric, each exposed first portion forming a first connection pad. The second electrically conductive wire braid is woven into the fabric, wherein a plurality of second portions of the second electrically conductive wire braid are exposed at the first surface of the fabric, each exposed second portion forming a second connection pad. The first electronic component has a first connection point and a second connection point, wherein the first connection point of the first electronic component is mechanically and electrically attached to one of the first connection pads of the first electrically conductive wire braid, and the second connection point of the first electronic component is mechanically and electrically attached to one of the second connection pads of the second electrically conductive wire braid. The second electronic component has a first connection point and a second connection point, wherein the first connection point of the second electronic component is mechanically and electrically attached to another one of the first connection pads of the first electrically conductive wire braid, and the second connection point of the second electronic component is mechanically and electrically attached to another one of the second connection pads of the second electrically conductive wire braid. The first connection point of the first electronic component is commonly connected to the first connection point of the second electronic component by the first electrically conductive wire braid, and the second connection point of the first electronic component is commonly connected to the second connection point of the second electronic component by the second electrically conductive wire braid.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a conductive fabric. Those of ordinary skill in the art will realize that the following detailed description of the conductive fabric are illustrative only and is not intended to be in any way limiting. Other embodiments of the conductive fabric will readily suggest themselves to such skilled persons having the benefit of this disclosure.

Reference will now be made in detail to implementations of the conductive fabric as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the term "fabric" generally applies to cloth or other similar materials made of threads, fibers, filaments or the like, generally referred to herein as "threads". Materials used for threads can include, but are not limited to, cotton, wool, nylon, polyester or other synthetic materials.

As used herein, the terms "weaving" or "woven" generally refer to mixing or blending together and is applied herein to describe the manner by which a wire braid is integrated as part of a fabric. The wire braid is woven into the fabric using conventional methodologies, for example weaving, stitching, felting or knitting, and is intended to include, but not be limited to, such similar concepts as intertwining, interweaving, interspersing, interlacing, intermingling and the like of the wire braid and fabric threads. Although the following description refers to "weaving" the wire braid into the fabric threads, it is intended that such description is intended to refer to the general concept of intermixing the wire braid and the fabric threads such that select portions, but not the entirety, of the wire braid is exposed at one or more surfaces of the fabric.

Figure 1:
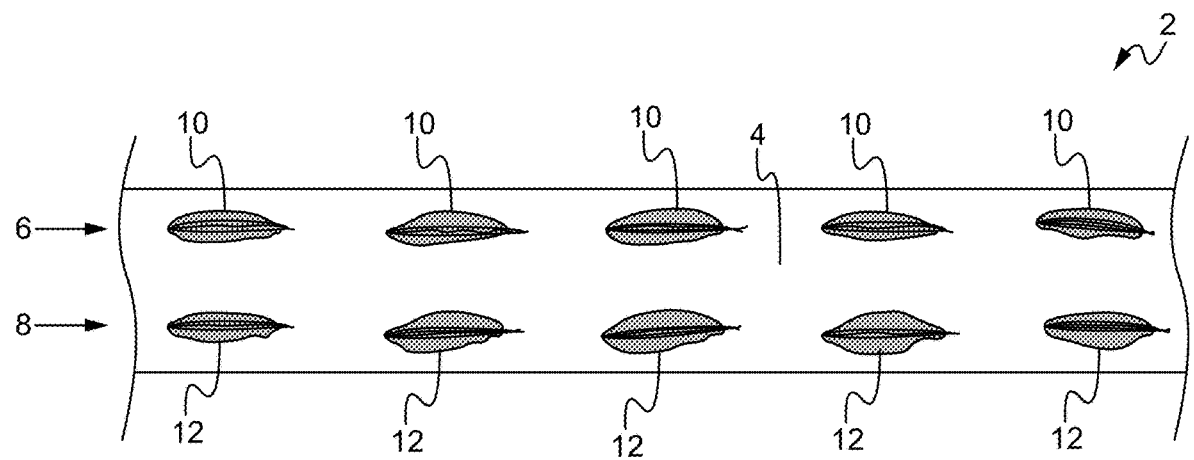
FIG. 1 illustrates a top down view of a conductive fabric having two wire strands woven into a fabric according to an embodiment.

FIG. 1 illustrates a top down view of a conductive fabric having two wire strands woven into a fabric according to an embodiment. A conductive fabric 2 includes a fabric 4 and wire strands 6 and 8 woven into the fabric 4. In the exemplary configuration shown in FIG. 1, there are two wire strands woven into the fabric. It is understood that more, or less, than two wire strands can be woven into the fabric. It is also understood that the relative spacing between adjacent wire strands is application specific and can be varied. Each wire strand is woven into the fabric such that one or more portions of the wire strand are exposed at a surface of the fabric. In the exemplary configuration shown in FIG. 1, portions 10 of wire strand 6 are exposed at a top surface, or front side surface, of the fabric 4, and portions 12 of wire strand 8 are exposed on the top surface of the fabric 4. The number, positions, and sizes of the exposed portions of each wire strand can vary by application. In the exemplary configuration shown in FIG. 1, the number and size of the exposed portions 10 for wire strand 6 are the same as the number and size of the exposed portions 12 for the wire strand 8, and each exposed portion 10 of the wire strand 6 is aligned with a corresponding exposed portion 12 of the wire strand 8. The exposed portions 10 and 12 can be used as connection pads for attaching electronic components. Solder, conductive adhesive or the like can be used to attach a connection point, such as a solder pad, solder bump, or metal lead, of the electronic component to the exposed portion 10, 12.

Wire strands are made of a plurality of individual electrically conductive fibers, filaments, or wires, such as thin copper wires, twisted together along a longitudinal axis so as to stay together. Unfortunately, the individual wires tend to separate and spread apart, especially during a soldering process, which may lead to separation of the wires at the exposed portions of the wire strand. Such separation results in a non-continuous attachment area that may cause difficulties with quality control of the attachment process, such as the soldering process, or even result in exposed portions incapable of being used as attachment areas.

Figure 2:
FIG. 2 illustrates a top down view of an exemplary wire braid according to an embodiment.

In some embodiments, wire braids are used instead of wire strands. A wire braid is made of a plurality of electrically conductive wires braided together. Wire braids have a more robust composition than wire strands. As such, the individual wires of a wire braid do not tend to separate and spread apart, which provides a more effective attachment area. FIG. 2 illustrates a top down view of an exemplary wire braid according to an embodiment. The wire braid 26 is made of a plurality of electrically conductive wires 46 braided together. In some embodiments, the electrically conductive wires 46 are metal wires. Examples of such metal wires include, but are not limited to, copper, silver, steel, nickel, and their alloys. In some embodiments, the metal wires are coated with a plating finish to protect from corrosion and enhance electrical conductivity. Examples of such plating finishes include, but are not limited to, gold flash over nickel, silver, or solder. The gauge of the metal wire can vary by application. Further, the geometry of the wire braid 26 can vary by application. It is understood that the braiding pattern formed by the plurality of electrically conductive wires can vary from that shown in FIG. 2. In some embodiments, the wire braid is a desoldering metal braid, also called a solder wick or desolder wick, which is a braid made of copper wire and the braid is coated with rosin flux. In other embodiments, the wire braid is made of individual copper wires coated with tin for improved soldering.

Figure 3:
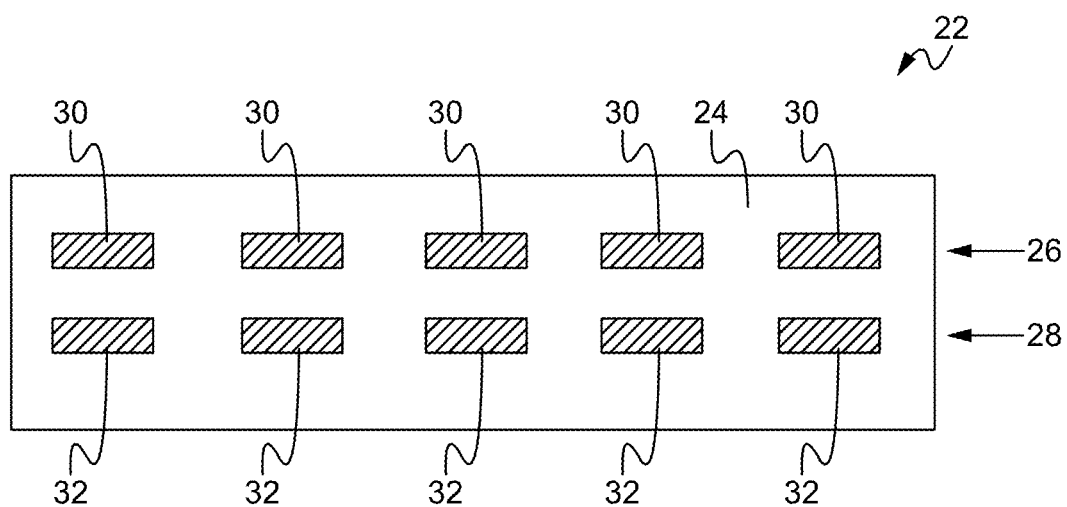
FIG. 3 illustrates a top down view of a conductive fabric having two wire braids woven into a fabric according to an embodiment.

FIG. 3 illustrates a top down view of a conductive fabric having two wire braids woven into a fabric according to an embodiment. A conductive fabric 22 includes a fabric 24 and wire braids 26 and 28 woven into the fabric 24. In the exemplary configuration shown in FIG. 3, there are two wire braids woven into the fabric. It is understood that more, or less, than two wire braids can be woven into the fabric. It is also understood that the relative spacing between adjacent wire braids is application specific and can be varied. Each wire braid is woven into the fabric such that one or more portions of the wire braid are exposed at a surface of the fabric. In the exemplary configuration shown in FIG. 3, portions 30 of wire braid 26 are exposed at a top surface of the fabric 24, and portions 32 of wire braid 28 are exposed on the top surface of the fabric 24. The number, positions, and sizes of the exposed portions of each wire braid can vary by application. In the exemplary configuration shown in FIG. 3, the number and size of the exposed portions 30 for wire braid 26 are the same as the number and size of the exposed portions 32 for the wire braid 28, and each exposed portion 30 of the wire braid 26 is aligned with a corresponding exposed portion 32 of the wire braid 28. The exposed portions 30 and 32 can be used as connection pads for attaching electronic components. Solder, conductive adhesive or the like can be used to attach a connection point, such as a solder pad, solder bump, or metal lead, of the electronic component to the exposed portion 30, 32. An exemplary soldering technique is surface mount soldering using standard lead-free solder such as SAC305 with reflow temperature of 240 degrees Celsius and above. Another exemplary soldering technique uses low temperature solder such as SnBiAg with reflow temperature of 138 degrees Celsius or BiInSn with reflow temperature of 80 degrees Celsius. Yet another exemplary soldering technique is laser soldering.

Figure 4:
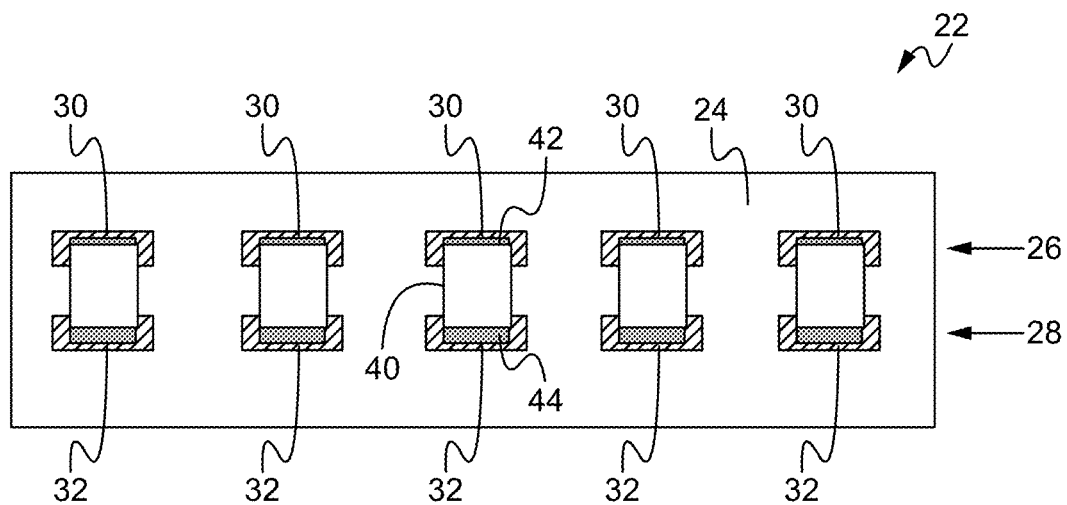
FIG. 4 illustrates a top down view of the conductive fabric of FIG. 3 with attached electronic components.

FIG. 4 illustrates a top down view of the conductive fabric of FIG. 3 with attached electronic components. An electronic component is coupled to the conductive fabric via one or more electrically conductive wire braids. The electronic component can be any conventional electronic component including, but not limited to, an active electronic component such as an integrated circuit, a passive electronic component such as a resistor, a capacitor and an inductor, and a power supply. In the exemplary embodiment shown in FIG. 4, each electronic component 40 is connected to the two wire braids 26 and 28.

Each electronic component 40 has one or more electrical connection points for off-component electrical connectivity. In the exemplary configuration shown in FIG. 4, each electronic component 40 includes two electrical connection points 42 and 44. It is understood that each electronic component can include more or less than two electrical connection points, and that the electrical connection points can be alternatively positioned than that shown in FIG. 4. Examples of electrical connection points include, but are not limited to, bond pads, solder bumps, and metal leads. It is understood that other types of conventional electrical connection points can be used. In some embodiments, there is one connection pad coupled to each electrical connection point. The connection point of each electronic component can be attached to a corresponding connection pad by soldering, welding or using electrically conductive adhesive. It is understood that other conventional methods can be used to provide a mechanical and electrical connection between the electrical connection point and the connection pad of the wire braid.

As shown in FIG. 4, a select one connection pad 30 of the wire braid 26 is coupled to the electrical connection point 42 of each electronic component 40, and a select one connection pad 32 of the wire braid 28 is coupled to the electrical connection point 44 of each electronic component 40. In this exemplary configuration, all the electronic components 40 are commonly interconnected, such as a string of LEDs that are collectively turned ON and OFF as a group. It is understood that alternative configurations are possible to commonly interconnect sub-sets of electronic components, with separate sub-sets being electrically independent from each other. It is also understood that individual electronic components can be independently connected to one or more connection pads for electrical interconnection independent from all other electronic components connected to the conductive fabric. In such alternative configurations, alternative wire braid configurations than that shown in FIGS. 3 and 4 are required. It is understood that the wire braids can be woven in different configurations than the parallel configuration shown in FIGS. 3 and 4. It is also understood that more, or less, than two wire braids can be woven into the fabric, in any desired pattern and relative position. It is also understood that the relative spacing between adjacent wire braids is application specific and can be varied. The number, positions, and sizes of the exposed portions of each wire braid can also vary by application. One or more wire braids can be woven into the fabric, each wire braid having its own select exposed portions which can be arranged independent of exposed portions of other wire braids, or can be selectively aligned and coordinated with exposed portions of other wire braids.

In some embodiments, an insulating encapsulation layer is added over a front side of the conductive fabric including the front side exposed portions of the wire braids and attached electronic components. A back side encapsulation layer can also be added over the back side of the conductive fabric including any back side exposed portions of the wire braid. In some embodiments, the encapsulation layer is an elastic material, such as an elastic polymer, or elastomer, which is a polymer with viscoelasticity. It is understood that alternative elastic substrates can be used including, but not limited to, silicone, urethane, latex and spandex, also referred to as elastane. The encapsulation layer provides environmental protection as well as electrical insulation of the wire braids and electronic components.

Although embodiments of the electronics assembly are described above as wearable electronics assembly, the general concepts described herein can be applied generally to electronics coupled to fabrics, wearable or otherwise.

The present application has been described in terms of specific embodiments incorporating details to facilitate the understanding of the principles of construction and operation of the conductive fabric. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An electronics assembly comprising:
   a. a fabric having a first surface;
   b. a first electrically conductive wire braid woven into the fabric, wherein a plurality of first non-end portions of the first electrically conductive wire braid are exposed at the first surface of the fabric, each exposed first non-end portion forming a first connection pad;
   c. a second electrically conductive wire braid woven into the fabric, wherein a plurality of second non-end portions of the second electrically conductive wire braid are exposed at the first surface of the fabric, each exposed second non-end portion forming a second connection pad;
   d. a first electronic component having a first connection point and a second connection point, wherein the first connection point of the first electronic component is mechanically and electrically attached to be in direct contact with one of the first connection pads of the first electrically conductive wire braid, and the second connection point of the first electronic component is mechanically and electrically attached to be in direct contact with one of the second connection pads of the second electrically conductive wire braid; and
   e. a second electronic component having a first connection point and a second connection point, wherein the first connection point of the second electronic component is mechanically and electrically attached to be in direct contact with another one of the first connection pads of the first electrically conductive wire braid, and the second connection point of the second electronic component is mechanically and electrically attached to be in direct contact with another one of the second connection pads of the second electrically conductive wire braid, the first connection point of the first electronic component is commonly connected to the first connection point of the second electronic component by the first electrically conductive wire braid, and the second connection point of the first electronic component is commonly connected to the second connection point of the second electronic component by the second electrically conductive wire braid, wherein the first electronic component and the second electronic component are each positioned on a same side of the fabric as the first surface.

2. The electronics assembly of claim 1 wherein the first connection points and the second connection points of each of the first electronic component and the second electronic component each comprise a bond pad, a solder bump, or a metal lead.

3. The electronics assembly of claim 1 wherein the first connection point of the first electronic component is coupled to one of the first connection pads of the first electrically conductive wire braid and the first connection point of the second electronic component is coupled to another one of the first connection pads of the first electrically conductive wire braid, and the second connection point of the first electronic component is coupled to one of the second connection pads of the second electrically conductive wire braid via a solder joint, a welded joint or an electrically conductive adhesive and the second connection point of the second electronic component is coupled to another one of the second connection pads of the second electrically conductive wire braid via a solder joint, a welded joint or an electrically conductive adhesive.

4. The electronics assembly of claim 1 wherein the first electrically conductive wire braid and the second electrically conductive wire braid each comprise a plurality of electrically conductive wires braided together.

5. The electronics assembly of claim 4 wherein each of the plurality of electrically conductive wires comprise a metal wire made of one or more of copper, silver, nickel and their alloys.

6. The electronics assembly of claim 4 wherein each of the plurality of electrically conductive wires comprise a metal wire with flux.

7. The electronics assembly of claim 4 wherein each of the plurality of electrically conductive wires comprise an electrically conductive plating finish.

8. The electronics assembly of claim 1 further comprising an encapsulation layer coupled to the first electronic component, the second electronic component, the first electrically conductive wire braid, and the second electrically conductive wire braid.

9. The electronics assembly of claim 1 wherein the first connection point of the first electronic component only contacts the first electrically conductive wire braid at one of the exposed first non-end portions at the first surface and the second connection point of the first electronic component only contacts the second electrically conductive wire braid at one of the exposed second non-end portions at the first surface, and the first connection point of the second electronic component only contacts the first electrically conductive wire braid at one of the exposed first non-end portions at the first surface and the second connection point of the second electronic component only contacts the second electrically conductive wire braid at one of the exposed second non-end portions at the first surface.

10. The electronics assembly of claim 1 wherein a remaining portion of the first electrically conductive wire braid is not exposed at the first surface of the fabric, and a remaining portion of the second electrically conductive wire braid is not exposed at the first surface of the fabric.

* * * * *